(12) United States Patent
Akimoto et al.

(10) Patent No.: US 10,359,897 B2
(45) Date of Patent: Jul. 23, 2019

(54) DISPLAY DEVICE WITH TOUCH SENSOR

(71) Applicant: Japan Display Inc., Minato-ku (JP)

(72) Inventors: Hajime Akimoto, Minato-ku (JP); Mitsuhide Miyamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/967,768

(22) Filed: May 1, 2018

(65) Prior Publication Data

US 2018/0321766 A1    Nov. 8, 2018

(30) Foreign Application Priority Data

May 8, 2017    (JP) .................................. 2017-092252

(51) Int. Cl.
| | |
|---|---|
| *G06F 3/041* | (2006.01) |
| *G06F 3/044* | (2006.01) |
| *G09G 3/3266* | (2016.01) |
| *H01L 51/52* | (2006.01) |
| *H01L 27/32* | (2006.01) |

(52) U.S. Cl.
CPC ............ *G06F 3/044* (2013.01); *G06F 3/0412* (2013.01); *G06F 3/0416* (2013.01); *G09G 3/3266* (2013.01); *H01L 27/3262* (2013.01); *H01L 27/3276* (2013.01); *H01L 51/5253* (2013.01); *G09G 2310/0245* (2013.01); *G09G 2310/0278* (2013.01); *H01L 27/323* (2013.01)

(58) Field of Classification Search
None
See application file for complete search history.

(56) References Cited

U.S. PATENT DOCUMENTS

| | | | |
|---|---|---|---|
| 2015/0060817 A1 | 3/2015 | Sato et al. | |
| 2017/0222180 A1 | 8/2017 | Sato et al. | |

FOREIGN PATENT DOCUMENTS

JP    2015-050245    3/2015

*Primary Examiner* — Nicholas J Lee
(74) *Attorney, Agent, or Firm* — Oblon McClelland, Maier & Neustadt, L.L.P.

(57) ABSTRACT

A display device according to an embodiment of the present invention includes: a plurality of first electrodes arranged on a plurality of display elements, a plurality of second electrodes arranged in a layer identical to or different from a layer of the first electrodes, and a plurality of first touch signal lines connected to the plurality of first electrodes; a plurality of connection terminal provided in the peripheral area; a first switch which switches a status of an electric connection between one of the plurality of image signal lines and one of the plurality of connection terminals from connected to disconnected, or vice versa; and a second switch which switches a status of an electric connection between one of the plurality of first touch signal lines and the one of the plurality of connection terminals from connected to disconnected, or vice versa.

11 Claims, 10 Drawing Sheets

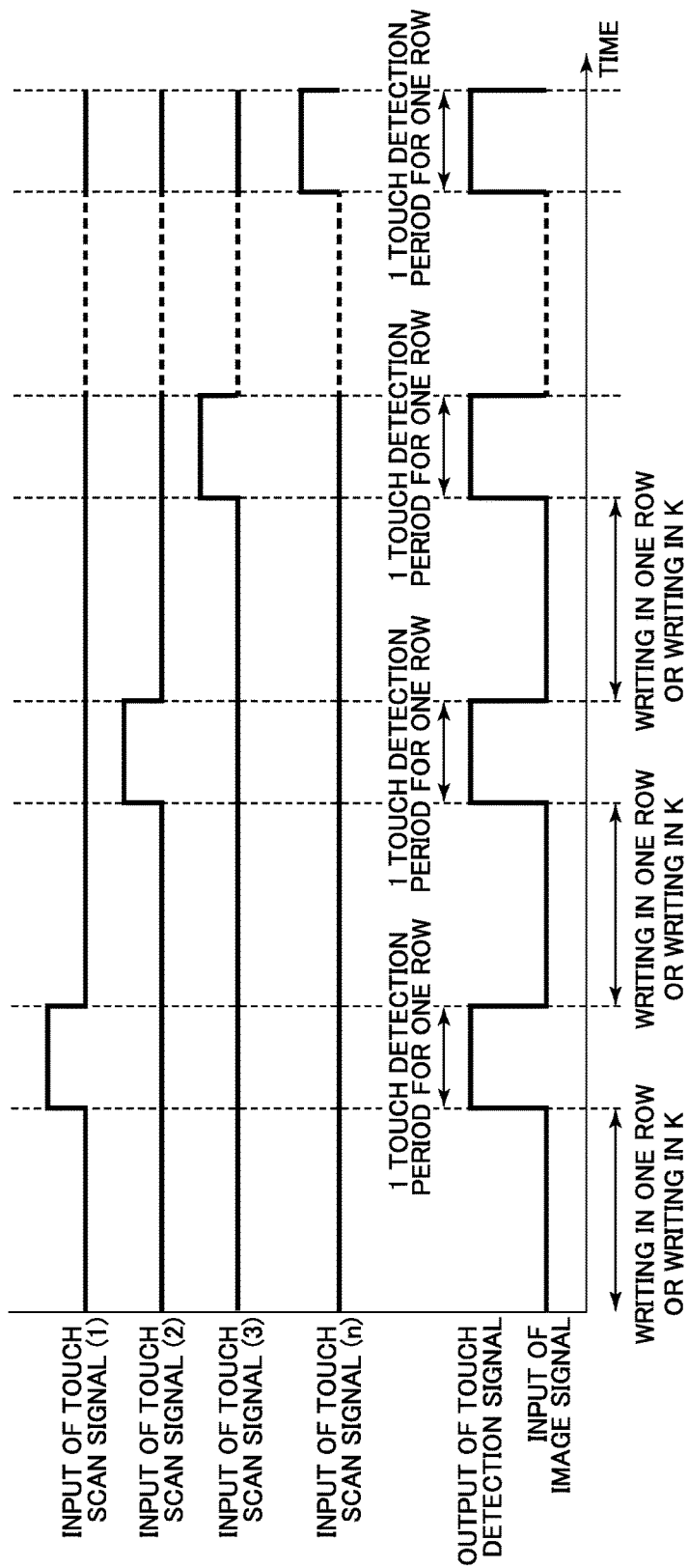

DISPLAY DEVICE WITH TOUCH SENSOR

CROSS-REFERENCE TO RELATED APPLICATION

The present application claims priority from Japanese application JP2017-92252 filed on May 8, 2017, the content of which is hereby incorporated by reference into this application.

BACKGROUND OF THE INVENTION

1. Field of the Invention

One or more embodiments of the present invention relate to a display device with a built-in touch sensor.

2. Description of the Related Art

For Example, JP2015-050245A discloses a display device with a built-in electrostatic capacitance type touch sensor, where a first electrode adjacent main body parts of which are connected to each other via the connection part and which extends in the X-direction, and a second electrode adjacent main body parts of which are connected to each other via the connection part and which extends in the Y-direction are arranged to be opposed to each other with an interposition of a sealing film.

SUMMARY OF THE INVENTION

Generally, in a peripheral area of the display device, many connection terminals which are connected to a display element are provided. When it is tried to build the touch sensor in a display device and additionally provide, in the peripheral area, a connection terminal which is connected to a touch sensor, it may become difficult to secure a space for a new connection terminal.

An objective of the present invention is to provide a display device with a built-in touch sensor capable of suppressing an increase of a number of the connection terminals.

A display device according to an embodiment of the present invention includes: a plurality of display elements provided in a display area; a plurality of image signal lines supplying an image signal to the plurality of display elements; a plurality of first electrodes arranged on the plurality of display elements, the first electrodes which are adjacent to each other in a first direction from among the plurality of the first electrodes being connected to each other via a first connecting line, and the first electrodes which are adjacent to each other in a second direction intersecting the first direction from among the plurality of the first electrodes not being connected to each other; a plurality of second electrodes which are arranged in a layer identical to or different from a layer of the first electrodes, and each of which are surrounded by the first electrodes in a plan view, the second electrodes which are adjacent to each other in a second direction from among the plurality of the second electrodes being connected to each other via a second connecting line intersecting the first connecting line with an interposition of an insulating film in a plan view, and the second electrodes which are adjacent to each other in a first direction from among the plurality of the second electrodes not being connected to each other; a plurality of first touch signal lines which are connected to the plurality of first electrodes; a plurality of connection terminal provided in the peripheral area; a first switch which switches a status of an electric connection between one of the plurality of image signal lines and one of the plurality of connection terminals from connected to disconnected, or vice versa; and a second switch which switches a status of an electric connection between one of the plurality of first touch signal lines and the one of the plurality of connection terminals from connected to disconnected, or vice versa.

BRIEF DESCRIPTION OF THE DRAWINGS

FIG. 7 is a diagram illustrating still another exemplary timing of a display operation and a touch detection.

DETAILED DESCRIPTION OF THE INVENTION

Figure 1:
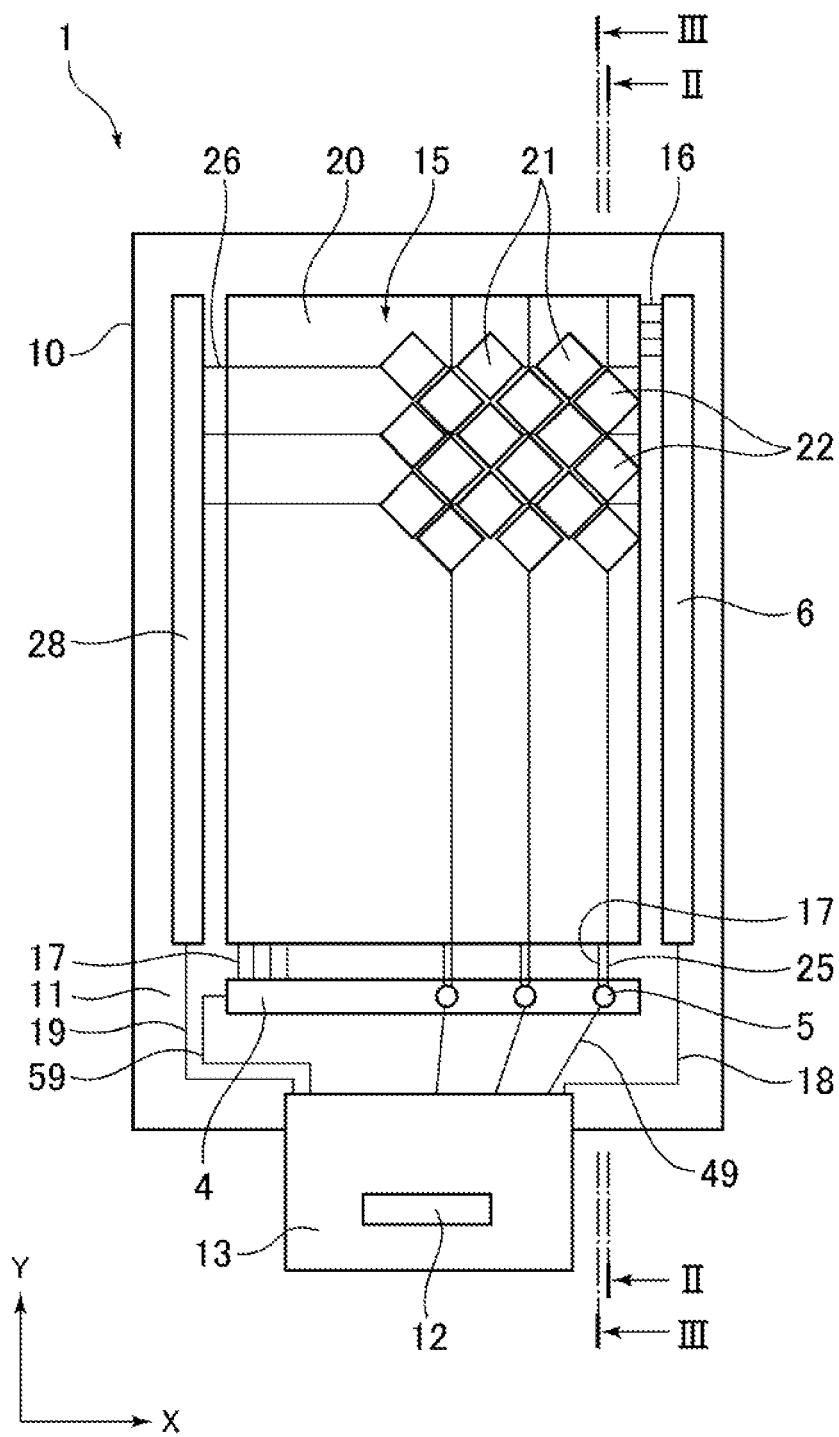
FIG. 1 is a plan view of a display device with a built-in touch sensor according to an embodiment.

Below, the respective embodiments of the present invention will be described, referring to the drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Further, in the detailed description of the one or more embodiments of the invention, when a positional relationship between one component and another component is defined, the words "on" and "under" are not used only in a case where the other component is positioned directly on or under the one component, but those words are also used in a case where still another component is interposed between the one component and the other component, unless otherwise stated.

FIG. 1 is a plan diagram of a display device with a built-in touch sensor according to an embodiment (hereinafter referred to simply as a display device). As an example of the display device, an organic EL display device can be mentioned. A display device 1 is configured to form a full color pixel by combining unit pixels (subpixels) of multiple colors composed of red, green, and blue, for example, and displays a full color image.

The display device 1 has a display panel 10, and a touch sensor 20 formed on a display area 15 of the display panel 10. Outside the display area 15 of the display panel, a peripheral area (a frame area) 11 is formed. To one side of the peripheral area 11, an FPC (a flexible printed circuit substrate) 13 for electric connection to an outer part is connected, and on the FPC 13 an integrated circuit chip 12 is mounted which drives a display element (a unit pixel) provided on the display area 15, and which inputs a driving signal to the touch sensor 20 and outputs a detection signal.

In the explanations below, a direction along the side of the peripheral area 11 to which the FPC 13 is connected is X-direction (which is a direction toward the right side in FIG. 1), and a direction which is orthogonal to the X-direction is Y-direction (which is an upward direction in FIG. 1).

In the display area 15, a plurality of scan signal lines 16 which extend in the X-direction and a plurality of image signal lines 17 which extend in the Y-direction are formed. On one of the two sides of the peripheral area 11, between which there is the display area 15 and which face each other in the X-direction, a scan line driving circuit 6 is disposed which supplies a scan signal to the scan signal lines 16. The scan line driving circuit 6 includes a plurality of shift registers, and applies an On voltage to the plurality of scan signal lines 16 in order according to a timing signal input from the integrated circuit chip 12 via a control signal line 18.

In the present embodiment, on the other one of the two sides of the peripheral area 11 between which there is the display area 15 and which face each other in the X-direction, a touch driving circuit 28 is disposed which supplies a driving signal to the touch sensor 20. That is, the touch driving circuit 28 is disposed on the side opposite from the scan driving circuit 6 with respect to the display area 15. The touch driving circuit 28 outputs driving signals to touch signal lines 26 of the touch sensor 20 simultaneously or in order according to timing signals input from the integrated circuit chip 12 via the control line 19.

In FIG. 1, along one of the two sides of the peripheral area 11 between which there is the display area 15 and which face each other in the X-direction, the scan driving circuit 6 is disposed, and along the other one of the two sides, the touch driving circuit 28 is disposed. However, each of the scan driving circuit 6 and the touch driving circuit 28 may be disposed on both of the two sides, and the scan driving circuit 6 and the touch driving circuit 28 may be formed integrally.

The image signal line 17 extends in the negative Y-direction over the display area 15 and is led out to the peripheral area 11, and supplies an image signal from the integrated circuit chip 12 to the display element provided on the display area 15. In the present embodiment, on the side of the peripheral area 11 to which the FPC 13 is connected, a switching circuit 4 including a plurality of switching elements 5 is disposed. The switching element 5 switches an electric connection destination of the FPC 13 between the image signal line 17 and a touch signal line 25 of the touch sensor 20. Note that since a number of the image signal lines 17 are sufficiently larger than a number of the touch signal lines 25, all of the touch signal lines 25 are respectively connected to the switching elements 5, but most of the image signal lines 17 are connected to the FPC 13 directly, not through the switching elements 5. Detailed configuration and operation of the switching element 5 will be described later.

Figure 2:
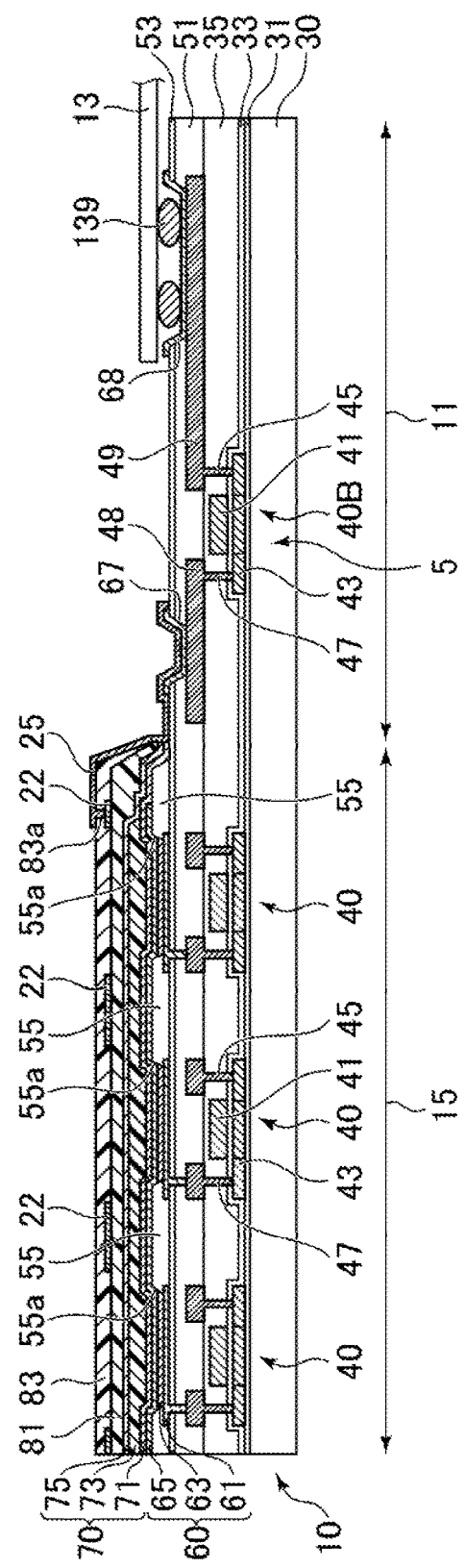
FIG. 2 is a cross sectional view taken along II-II line shown in FIG. 1.
Figure 3:
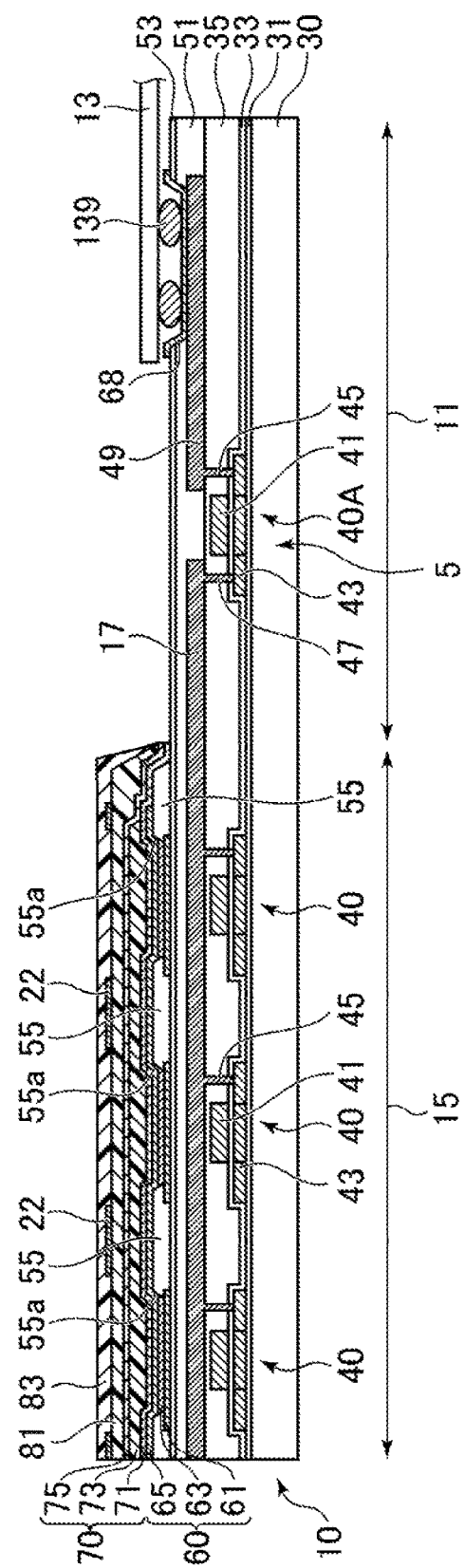
FIG. 3 is a cross sectional view taken along III-III line shown in FIG. 1.
Figure 4:
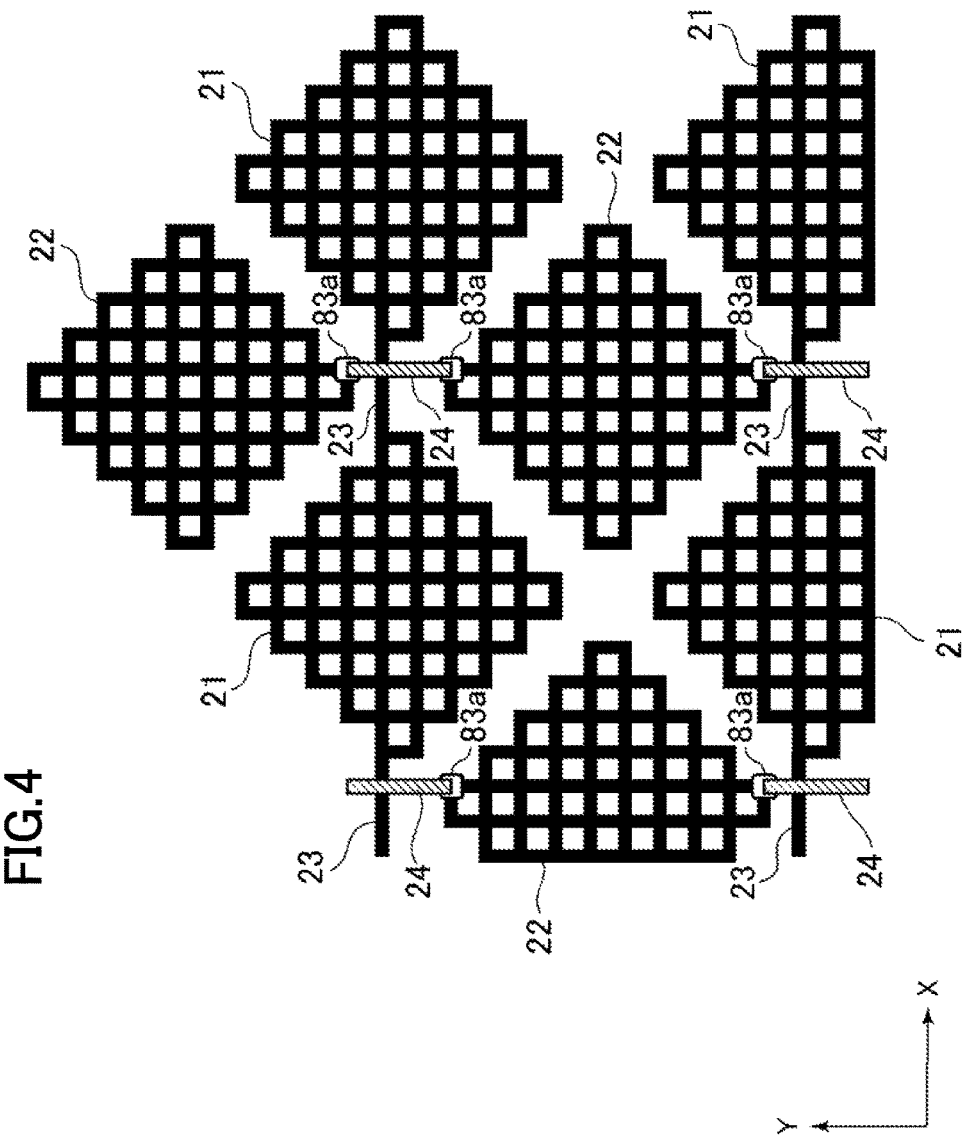
FIG. 4 is a magnified plan view of a part of the touch sensor.
Figure 5A:
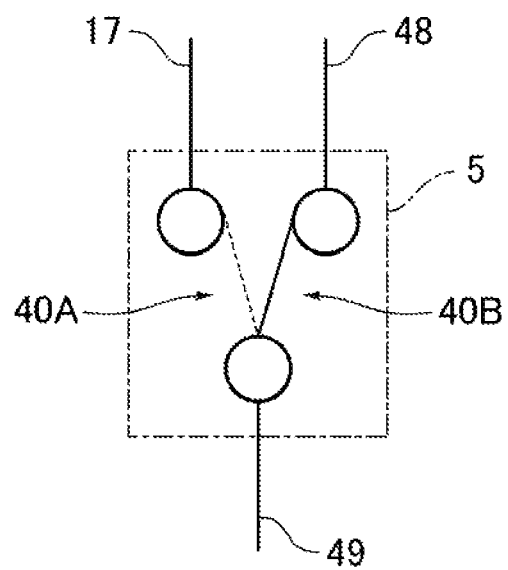
FIG. 5A is a circuit diagram illustrating an exemplary configuration of switching between a display operation and a touch detection.
Figure 5B:
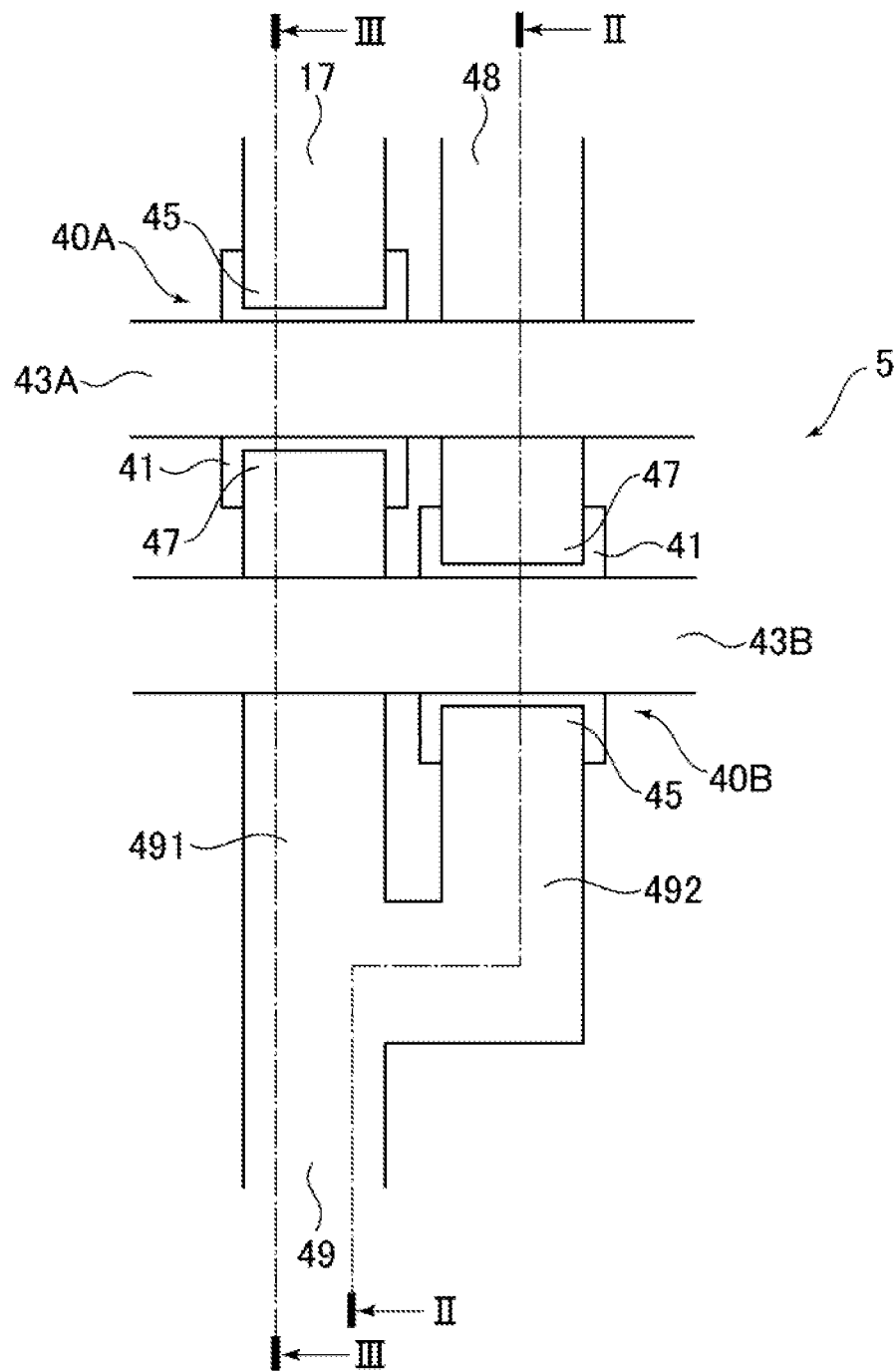
FIG. 5B is a plan view of an exemplary configuration of switching between a display operation and a touch detection.

FIG. 2 is a cross sectional diagram of a cross section along II-II line shown in FIG. 1, that is, a cross section along the touch signal line 25. FIG. 3 is a cross sectional diagram of a cross section along III-III line shown in FIG. 1, that is, a cross section along the image signal line 17. FIG. 4 is a magnified plan view of a part of the touch sensor 20. FIG. 5A and FIG. 5B are a circuit diagram and a plan diagram which illustrate configuration examples of the switching element 5. II-II line and III-III line shown in FIG. 1 are, in the switching element 5, as shown in FIG. 5B. In those cross sectional diagrams, hatching of some of the layers such as a substrate 30, a planarizing film 51, and a pixel separating film 55 is omitted for easy viewing of the cross sectional structure. In the explanation given hereinafter, the lamination direction is the upper direction.

The substrate 30 is formed of resin which has flexibility such as glass, and polyimide. An upper surface of the substrate 30 is covered by an under-coat layer 31. On the under-coat layer 31, a semiconductor layer 41 is formed, and the semiconductor layer 41 is covered by a gate insulating film 33. On the gate insulating film 33, a gate electrode 43 is formed, and the gate electrode 43 is covered by a passivation film 35. A drain electrode 45 and a source electrode 47 penetrate the gate insulating film 33 and the passivation film 35, and are connected to the semiconducting layer 41. The semiconductor layer 41, the gate electrode 43, the drain electrode 45, and the source electrode 47 constitute a thin film transistor 40. The thin film transistor 40 is provided so as to correspond to each of a plurality of unit pixels. The under-coat layer 31, the gate insulating film 33, and the passivation film 35 are formed of an inorganic insulating material such as $SiO_2$ and SiN. The semiconductor layer 41 is composed of semiconductor such as LTPS (Low Temperature Poly-silicon).

On the passivation film 35, in addition to the drain electrode 45 and the source electrode 47, the image signal line 17 connected to the thin film transistor 40, and connecting lines 48 and 49 for connection to the FPC 13 are formed. The drain electrode 45, the source electrode 47, the image signal line 17, and the connecting lines 48 and 49 are covered by the planarizing film 51, and the planarizing film 51 is covered by an interlayer insulating film 53. The drain electrode 45, the source electrode 47, the image signal line 17, and the connecting lines 48 and 49 are formed of a conductive material which contains, for example, Al, Ag, Cu, Ni, Ti, Mo, or the like. The planarizing film 51 is formed of an organic insulating material such as acrylic resin, and has a flat upper surface. The interlayer insulating film 53 is formed of an inorganic insulating material such as $SiO_2$ and SiN.

On the interlayer insulating film 53, a pixel electrode 61 is formed. The pixel electrode 61 penetrates the planarizing film 51 and the interlayer insulating film 53, and is connected to the source electrode 47. The pixel electrode 61 is individually provided so as to correspond to each of the plurality of unit pixels. In the present embodiment, the display panel 10 is a top emission type display panel, and the pixel electrode 61 is formed as a reflecting electrode. Further, in the peripheral area 11, a connection terminal 67 for connection to the touch signal line 25 to be described later and a connection terminal 68 for connection to the FPC 13 are formed, and the connection terminals 67 and 68 penetrates the planarizing film 51 and the interlayer insulating film 53, and are connected to the connecting lines 48 and 49, respectively. The pixel electrode 61 and the connection terminals 67 and 68 are formed to contain a conductive material which contains, for example, Al, Ag, Cu, Ni, Ti, Mo, or the like, and a conductive oxide such as ITO and IZO.

The pixel electrode 61 is covered by the pixel separating film 55. The pixel separating film 55 is also referred to as a rib or a bank. On the pixel separating film 55, an opening 55a is formed at a bottom where the pixel electrode 61 is exposed. The inner periphery part of the pixel separating film 55 which forms the opening 55a is on the peripheral part of the pixel electrode 61, and the pixel separating film 55 has a forward tapered shape; a width of the pixel separating film 55 in a cross sectional view becomes smaller as it extends from the bottom to the top. Note that the pixel separating film 55 is formed in the peripheral area 15, in the vicinity of the border between the peripheral area 11 and the display area 15, but is not formed in an area outside the above vicinity of the border. The pixel separating film 55 is formed of an organic insulating material such as acrylic resin and polyimide resin.

On the pixel electrode 61 which is exposed at the bottom of the opening 55a of the pixel separating film 55, the light emitting layers 63 are formed individually to be separated from one another. The light emitting layers 63 emit lights of a plurality of colors composed of, for example, red, green, and blue, corresponding to each of the plurality of pixels. Together with the light emitting layer 63, at least one of a hole transport layer, a hole injection layer, an electron transport layer, and an electron injection layer may be formed. The light emitting layer 63 is individually formed by vapor deposition, using a mask. Also, the light emitting layer 63 may be formed continuously over openings 55a which are adjacent to each other and over the pixel separating film therebetween by the vapor deposition, as a uniform film which spreads over the whole of the display area 15 (what is called a solid film), and in such a case the light emitting layers 63 emit light monochromatically, and respective light components of a plurality of colors such as red, green, and blue are extracted by a color filter or a color conversion layer. Note that the light emitting layer 63 may be formed also by application, instead of the vapor deposition.

The light emitting layer 63 and the pixel separating film 55 are covered by an opposite electrode 65. The opposite electrode 65 is formed as a uniform film which spreads over the whole of the display area 15 (what is called a solid film). A light emitting element 60 is composed of the light emitting layer 63, and the pixel electrode 61 and the opposite electrode 65 which hold the light emitting layer 63 therebetween. One of the pixel electrode 61 and the opposite electrode 65 becomes an anode, and the other one of the pixel electrode 61 and the opposite electrode becomes a cathode, and the light emitting layer 63 is made to emit light by an electric current which runs between the pixel electrode 61 and the opposite electrode 65. The opposite electrode 65 is formed of, for example, a transparent conductive material such as ITO and IZO or a metal film such as MgAg.

The pixel separating film 55 and the opposite electrode 65 is sealed by being covered by a sealing film (a passivation film) 70, and is thereby shut off from moisture. The sealing film 70 has a three-layer lamination structure which for example includes an inorganic film 71, an organic film 73, and an inorganic film 75 in this order from the lower side. The inorganic films 71 and 75 are formed of an inorganic material such as $SiO_2$ and SiN. The organic film 73 is formed of an organic insulating material such as acrylic resin, and planarizes the upper surface of the sealing film 70.

The outer peripheries of the inorganic films 71 and 75 of the sealing film 70 contact the interlayer insulating film 53 at a location outside the outer periphery of the pixel separating film 55. However, the configuration is not limited to this; the interlayer insulating film 53 may be omitted and the outer peripheries of the inorganic films 71 and 75 may contact the planarizing film 51.

The display device 1 has a touch sensor 20 on the sealing film 70. Specifically, a protective insulating film 81 is formed on the sealing film 70, and a plurality of first electrodes 21 and a plurality of second electrodes 22 are formed which are arranged two-dimensionally on the protective insulating film 81, and on the first electrodes 21 and the second electrodes 22 an interlayer insulating film 83 is formed. The first electrodes 21 and the second electrodes 22 constitute a driving electrode and a protecting electrode of the electrostatic capacitance type touch sensor. The protective insulating film 81 and the interlayer insulating film 83 are formed of, for example, an organic insulating material such as acrylic resin, or an inorganic insulating material such as $SiO_2$ and SiN.

In the present embodiment, the outer periphery of the protective insulating film 81 is aligned with the outer peripheries of the inorganic films 71 and 75 of the sealing film 70. This is because the protective insulating film 81 is utilized as a mask when selectively removing the inorganic insulating films 71 and 75. Note that the protective insulating film 81 may be omitted.

As illustrated in FIG. 1 and FIG. 4, respective units of the first electrodes 21 and the second electrodes 22 are formed to have a rectangular shape where the X-direction (a first direction) and the Y-direction (a second direction) which intersects (e.g., is orthogonal to) the X-direction are diagonal directions, that is, what is called a rhombic shape (a diamond shape). Further, both of the first electrodes 21 and the second electrodes 22 are made of a conductive material such as metal, and the first electrodes 21 and the second electrodes 22 are formed in a mesh shape (a mesh wiring) so that the conductive material does not overlap the light emitting area of the light emitting element 60 in a plan view. The configuration is not limited to this, and the first electrodes 21 and the second electrodes 22 may be formed of a transparent conductive material such as ITO, as well.

The plurality of first electrodes 21 line up in the X-direction and in the Y-direction, respectively, to be arranged two-dimensionally. Of those first electrodes 21, first electrodes 21 which are adjacent to each other in the X-direction are connected to each another by a first connecting line 23, and first electrodes 21 which are adjacent to each other in the Y-direction are not connected to each other. That is, the plurality of first electrodes 21 respectively form a plurality of electrode rows which extend in the X-direction by connecting first electrodes 21 adjacent to each other in the X-direction by the first connecting line 23, and the respective electrode rows are electrically separated from one another in the Y-direction.

The plurality of second electrodes 21 also line up in the X-direction and in the Y-direction, respectively, to be arranged two-dimensionally. Of those second electrodes 22, second electrodes 22 which are adjacent to each other in the Y-direction are connected to each other by a second connecting line 24 which intersects the first connecting line 23 in a plan view, and second electrodes 21 which are adjacent to each other in the X-direction are not connected to each other. That is, the plurality of second electrodes 22 respectively form a plurality of electrode rows which extend in the Y-direction by connecting second electrodes 22 adjacent to each other in the Y-direction by the second connecting line 24, and the respective electrode rows are electrically separated from each other in the X-direction.

Each of the second electrodes 22 is arranged so as to be surrounded by the first electrodes 21 in a plan view. For example, each of the second electrodes 22 is arranged between first electrodes 21 which are adjacent to each other in a direction which intersects both the of the X-direction and the Y-direction (for example, 45 degrees or −45 degrees), and is surrounded by four first electrodes 21. The first electrodes 21 and the second electrodes 22 are spaced from one another so as not to contact one another, to thereby be electrically separated from one another.

In the present embodiment, the plurality of first electrodes 21 and the plurality of second electrodes 22 are arranged at a layer under the interlayer insulating film 83 (a first conductive layer). The configuration is not limited to this, and one of the plurality of first electrodes 21 and the plurality of second electrodes 22 may be arranged at a layer under the interlayer insulating film 83, and the other may be arranged on a layer on the interlayer insulating film 83 (a second conductive layer). Furthermore, both of the plurality of first electrode 21 and the plurality of second electrode 22 may be arranged at a layer on the interlayer insulating film 83.

The first connecting line 23 and the second connecting line 24 intersect each other in a plan view. Between the first connecting line 23 and the second connecting line 24 which intersect each other in a plan view, the interlayer insulating film 83 is interposed, and the two are electrically separated from each other.

In the present embodiment, the second connecting line 24 is arranged at a layer on the interlayer insulating film 83 (the second conductive layer), constituting what is called a bridge wiring. The second connecting line 24 is connected to the second electrode 22 via an opening (a through hole) 83a formed in the interlayer insulating film 83. The second electrode 22 is formed of a conductive material including, for example, Al, Ag, Cu, Ni, Ti, Mo, and the like. Whereas, the first connecting line 23 is integrally formed with the first electrodes 21 at a layer under the interlayer insulating film 83 (the first conductive layer).

The configuration is not limited to this; it may be configured that the first connecting line 23 is arranged at a layer on the interlayer insulating film 83 as the bridge wiring, and the second connecting line 24 is integrally formed with the second electrodes 22 at a layer under the interlayer insulating film 83. Further, it may be configured that an intersection part where the first connecting line 23, as the bridge wiring, intersects the second connecting line 24, and an intersection part where the second connecting line 24, as the bridge wiring, intersects the first connecting line 23 exist together.

In the present embodiment, the interlayer insulating film 83 is formed as a uniform film which spreads over the whole of the display area 15 (what is called a solid film). The configuration is not limited this, and it may be configured that the interlayer insulating film 83 is formed separately at the respective positions where the first connecting line 23 intersects the second connecting line 24 in a plan view, and does not cover the first electrode 21 and the second electrode 22.

The touch sensor 20 has the touch signal lines 25 and 26 which are led out to the peripheral area 11. The touch signal lines 25 and 26 are arranged at the layer on the interlayer insulating film 83 (the second conductive layer) as the bridge wiring is, and are connected to the first electrode 21 or the second electrode 22 via the opening (the through hole) 83a formed in the interlayer insulating film.

The touch signal line 26 connected to the first terminal 21 is led out in the negative X-direction and is connected to the touch driving circuit 28. A driving signal output from the touch driving circuit 28 is input to the first terminal 21 via the touch signal line 26. That is, in the present embodiment, the first electrode 21 becomes the driving electrode.

The touch signal line 25 connected to the second electrode 22 is led out in the negative Y-direction and is connected to each switching element 5 of the switching circuit 4. A detection signal output from the second electrode 22 is input to each switching element 5 of the switching circuit 4 via the touch signal line 25. That is, in the present embodiment, the second electrode 22 becomes the detecting electrode.

As illustrated in FIG. 2, FIG. 3, FIG. 5A, and FIG. 5B, in the peripheral area 11, switches 40A and 40B are provided which are made up a thin film transistor and are configured as the thin film transistor 40 provided in the display area 15. A pair of the switches 40A and 40B constitutes the switching element 5.

One edge of switch 40A (an example of a first switch) is connected to the image signal line 17, and the other edge is connected to a connecting line 49 which is connected to the FPC 13. One edge of the switch 40B (an example of a second switch) is connected to a connecting line 48 which is connected to the touch signal line 25 (an example of a first touch signal line), and the other edge is connected to the connecting line 49 as the switch 40A is.

The connecting line 49 is connected to the connection terminal 68 which is exposed in the peripheral area 11, and to this connection terminal 68 the FPC 13 is connected via an anisotropic conductive member 139 (see FIG. 2 and FIG. 3). An edge of the connecting line 49 is divided into two. One edge 491 is connected to the switch 40A, and the other edge 492 is connected to the switch 40B (see FIG. 5).

The connecting line 48 is connected to the connection terminal 67 exposed in the peripheral area 11, and to this connection terminal 67, the touch signal line 25 is connected (see FIG. 2). The outer peripheries of the inorganic films 71 and 75 of the sealing film 70 are positioned between the display area 15 and the switches 40A and 40B. The touch signal line 25 starts from a position over the inorganic film 71 and 75, extends to go beyond the outer peripheries of the inorganic films 71 and 75 to the outside of the inorganic films 71 and 75, and is connected to the connection terminal 67.

To switches 40A and 40B, a control signal is supplied from the integrated circuit chip 12 through a control signal line 59 (see FIG. 1). In FIG. 5B, both of the switches 40A and 40B are formed of a thin film transistor, and a control signal is given as a gate voltage to each thin film transistor. The integrated circuit chip 12 exclusively drives the switches 40A and 40B, to thereby switch the electric connection destination of the connection terminal 68 between the image signal line 17 and the touch signal line 25.

The switch 40A switches a status of an electric connection between the image signal line 17 and the connection terminal 68 from connected to disconnected, or vice versa, in accordance with a voltage applied to the gate electrode 43a communicated with the control signal line 59. Whereas, the switch 40B switches a status of an electric connection between the touch signal line 25 and the connection terminal 68 from connected to disconnected, or vice versa, in accordance with a voltage applied to the gate electrode 43b.

For example, the integrated circuit chip 12 turns on the switch 40A and turns off switch 50B, to thereby electrically connect the image signal line 17 and the connection terminal 68, and electrically disconnect the touch signal line 25 and the connection terminal 68. Whereas, the integrated circuit chip 12 turns off the switch 40A and turns on switch 50B, to thereby electrically connect the touch signal line 25 and the connection terminal 68, and electrically disconnect the image signal line 17 and the connection terminal 68.

According to such a configuration, it becomes possible to electrically connect the image signal line 17 and the connection terminal 68 and output an image signal from the integrated circuit chip 12 to the image signal line 17 in a display operation period, and to electrically connect the touch signal line 25 and the connection terminal 68 and input a detection signal from the touch signal line 25 to the integrated circuit chip 12 in a touch detection period. In other words, it becomes possible to use the connection terminal 68 for both of the output of an image signal and the input of a detection signal. In this manner, it becomes possible to suppress an increase of a number of the connection terminals 68.

Figure 6A:
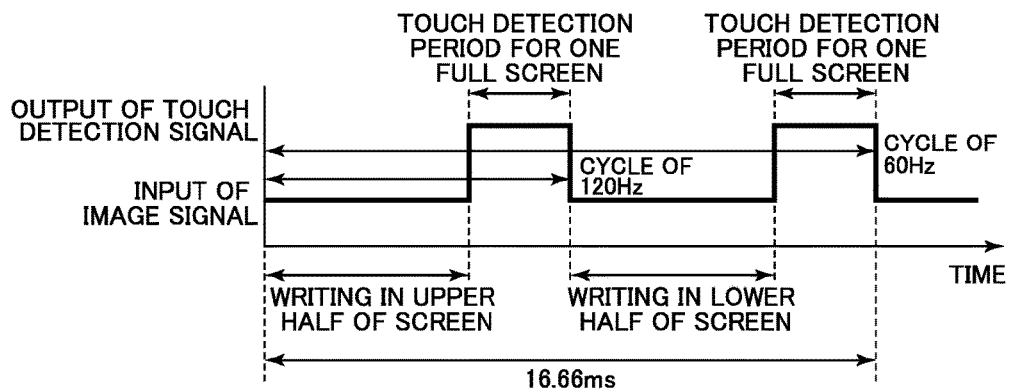
FIG. 6A is a diagram illustrating an exemplary timing of a display operation and a touch detection.
Figure 6B:
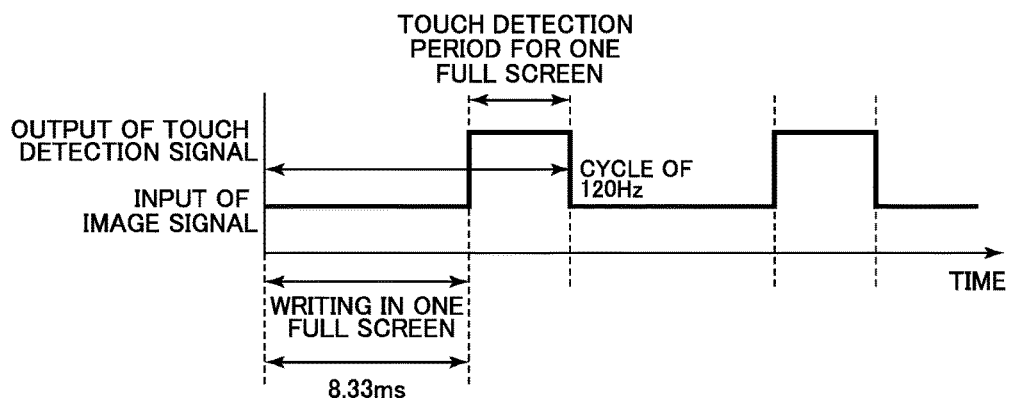
FIG. 6B is a diagram illustrating another exemplary timing of a display operation and a touch detection.

An exemplary timing of the display operation period and the touch detection period is explained. As illustrated in FIG. 6A and FIG. 6B, one vertical scanning period may be divided into the display operation period and the touch detection period. In the example of FIG. 6A, in one vertical scanning period (which is about 16.66 ms, in a case of a 60 Hz displaying, for example), as the display operation period, a writing period for an upper half of the screen and a writing period for a lower half of the screen are included during which data is written in the upper half and the lower half of the screen, respectively, and further the touch detection period is included after the respective writing periods. At this time, in each of the touch detection periods, a touch detection is performed for one full screen, and therefore according to the exemplary timing of FIG. 6A, each time one frame is written into the screen, two touch detections are performed.

In the example of FIG. 6B, in one vertical scanning period (which is about 8.33 ms in a case of a 120 Hz displaying, for example), a writing period for writing into a full screen is included as the display operation period, and after the touch detection period is included after the writing period. Unlike the example of FIG. 6A, each time one frame is written into the screen, one touch detection is performed.

In the touch detection periods of these examples, a driving signal is simultaneously output from the touch driving circuit 28 to the plurality of touch signal lines 26, a detection signal is simultaneously input to the integrated circuit chip 12 from the plurality of touch signal lines 25.

As illustrated in FIG. 7, one horizontal scanning period may be divided into the display operation period and the touch detection period. That is, in one horizontal scanning period, a period during which data is written into a row of the screen is included as the display operation period, and after the display operation period the touch detection period is included. In the example of FIG. 7, each time data is written into one row, a driving signal is output from the touch driving circuit 28 to one of the plurality of touch signal lines 26, and a detection signal is input to the integrated circuit chip 12 from the touch signal line 25 corresponding to the one of the plurality of touch signal lines 26.

In this case, since the actual number of rows of the scan lines is tens of times more than the number of rows of the touch electrodes, while a display of one frame is completed, tens of touch detection operations are completed. There is no limitation as to a ratio of a number of displayed frames and a number of touch detections, and for example, it may be configured that each time data is written into the screen for k rows, a touch detection operation for one row is performed.

Below, a variation of the display device 1 is explained. As to the configurations which are the same with those in the embodiment as above, the same reference numbers are attached to such configurations, and detailed explanations about such configurations are not given.

Figure 8:
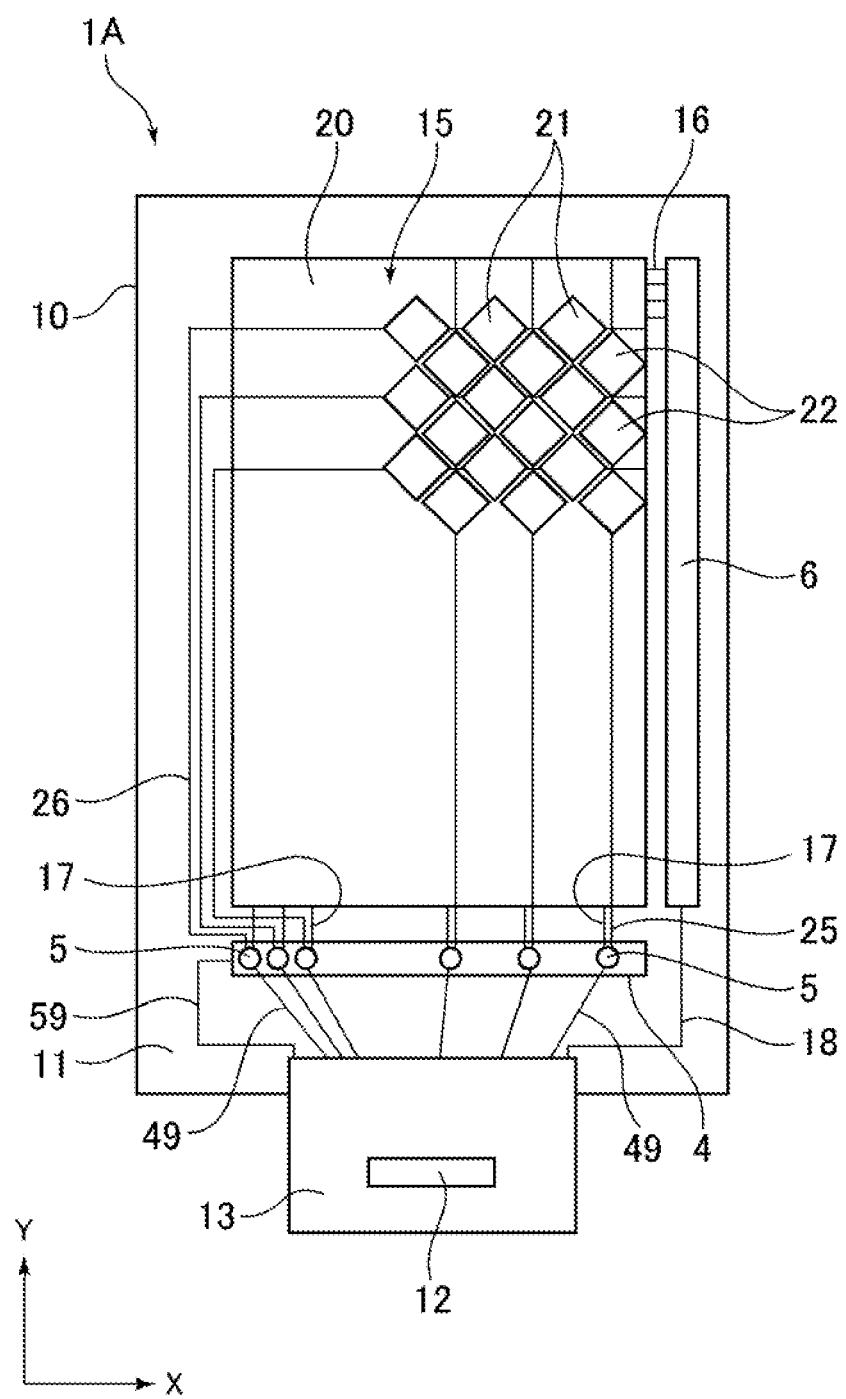
FIG. 8 is a plan view of a display device with a built-in touch sensor according to another embodiment.

From the display devices 1A illustrated in FIG. 8, the touch driving circuit 28 is omitted, and the integrated circuit chip 12 outputs a driving signal to the touch signal lines 26. The touch signal lines 26 extend to a side of the peripheral area 11 to which the FPC 13 is connected, and are connected to some of the switching elements 5 which is included in the switching circuit 4. Those switching elements 5 switch the electric connection destination of the FPC 13 between the image signal line 17 and the touch signal line 26.

The switching element 5 to which the touch signal line 26 is connected also includes, as illustrated in FIG. 5A and FIG. 5B as above, the switch 40A connected to the image signal line 17 and the connecting line 49, and the switch 40B connected to the connecting line 48 and the connecting line 49. The touch signal line 26 is, as the touch signal line 25 illustrated in FIG. 2 as above, connected to the connection terminal 67 which is connected to the connecting line 48 and is exposed at the peripheral area 11.

In the present embodiment, the switch 40A (an example of a third switch) included in the switching element 5 to which the touch signal line 26 is connected switches the status of the electric connection between the image signal line 17 and the connection terminal 68 from connected to disconnected, or vice versa. Whereas, the switch 40B (an example of a fourth switch) switches a status of an electric connection between the touch signal line 26 and the connection terminal 68 from connected to disconnected, or vice versa. The integrated circuit chip 12 drives the switch 40A and the switch 40B exclusively.

According to such a configuration, it becomes possible to, in the display operation period, electrically connect the image signal line 17 and the connection terminal 68 and output an image signal from the integrated circuit chip 12 to the image signal line 17, and to, in the touch detection period, electrically connect the touch signal line 26 and the connection terminal 68 and output a driving signal from the integrated circuit chip 12 to the touch signal line 26. In other words, it becomes possible to use the connection terminal 68 for both of the output of an image signal and the output of a driving signal.

Figure 9:
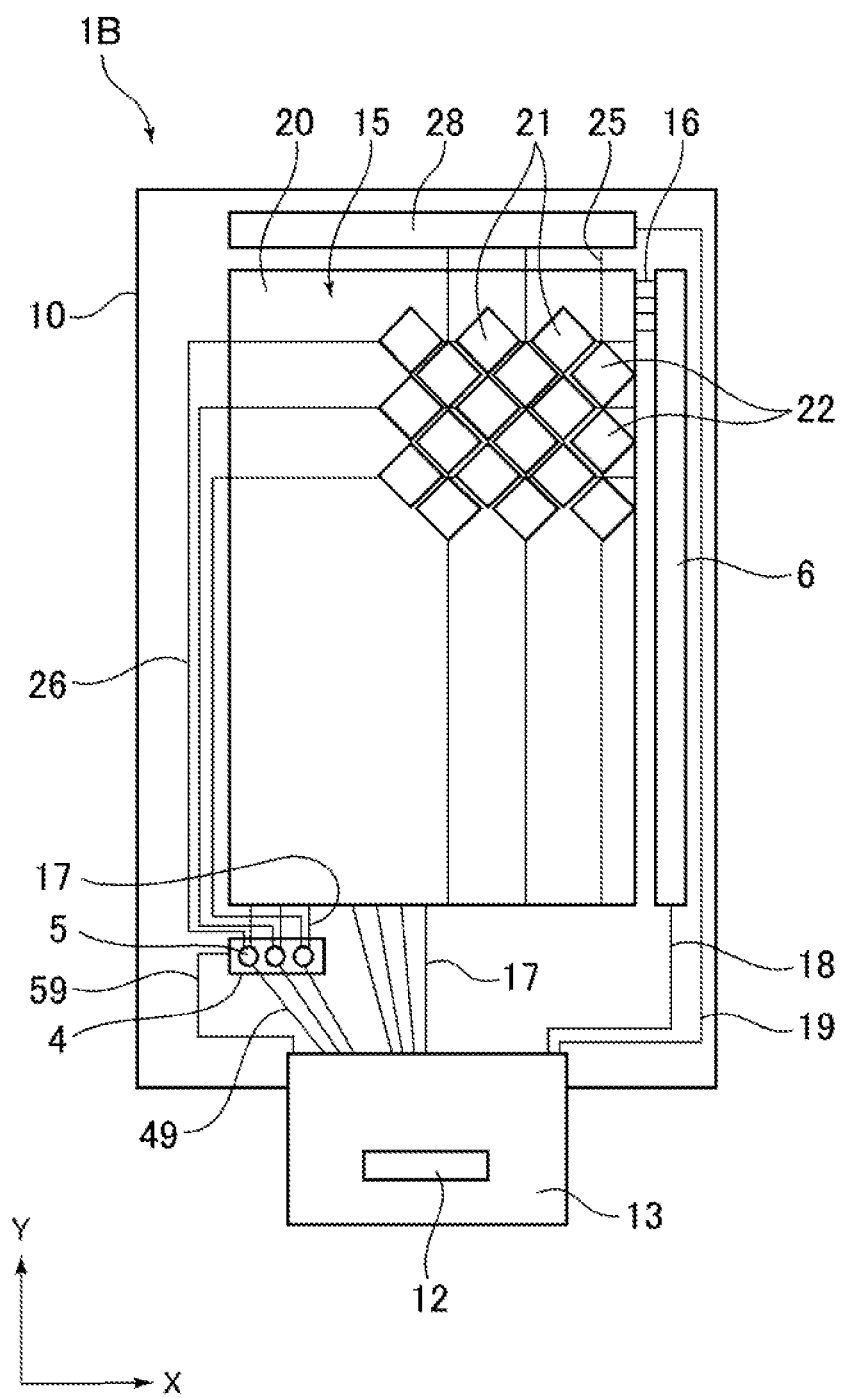
FIG. 9 is a plan view of a display device with a built-in touch sensor according to still another embodiment.

In the display device 1B illustrated in FIG. 9, the first electrode 21 becomes the detecting electrode, and the second electrode 22 becomes the driving electrode. The touch driving circuit 28 is arranged on a side opposite from the connection terminal 68 to which the FPC 13 is connected with respect to the display area 15. The touch signal line 25 connected to the second electrode 22 is led out in the Y-direction and is connected to the touch driving circuit 28. A driving signal output from the touch driving circuit 28 is input in the second electrode 22 via the touch signal line 25.

The touch signal line 26 connected to the first electrode 21 is led out in the negative X-direction, extends to a side of the peripheral area 11 to which the FPC 13 is connected, and is connected to each of the switching elements 5 of the switching circuit 4. A detection signal output from the first electrode 21 is input to each of the switching elements 5 of the switching circuit 4 via the touch signal line 26. Those switching elements 5 switch the electric connection destination of the FPC 13 between the image signal line 17 and the touch signal line 26, as the switching elements shown in FIG. 8 as above do.

In the present embodiment, the switch 40A (an example of the first switch) included in the switching element 5 to which the touch signal line 26 is connected switches the status of the electric connection between the image signal line 17 and the connection terminal 68 from connected to disconnected, or vice versa. Whereas, the switch 40B (an example of the second switch) switches the status of the electric connection between the touch signal line 26 and the connection terminal 68 from connected to disconnected, or vice versa. The integrated circuit chip 12 drives the switch 40A and the switch 40B exclusively.

According to such a configuration, it becomes possible to, in the display operation period, electrically connect the image signal line 17 and the connection terminal 68 and output an image signal from the integrated circuit chip 12 to the image signal line 17, and to, in the touch detection period, electrically connect the touch signal line 26 and the connection terminal 68 and input a detection signal from the touch signal line 26 to the integrated circuit chip 12. In other words, even if the relationship between the driving electrode and the detecting electrode is opposite from that of the embodiment as above, it becomes possible to use the connection terminal 68 for both of the output of an image signal and the input of a detection signal.

Note that as illustrated in FIG. 9, it is not necessary that the switching circuit 4 of the present embodiment is arranged to run along the whole of a side of the display area 15 extending in the X-direction, and the switching circuit 4 may be arranged to run along only a part of that side, close to which the touch signal lines 26 are arranged. In this case, it may be configured that only a part of the plurality of image signal lines 17 is connected to the switching circuit 4, and the rest of the plurality of image signal lines 17 is directly connected to the connection terminal 68 to which the FPC 13 is connected.

As to the present embodiment, we illustrated the organic EL display device as an example to be disclosed. Whereas, as another application example, any flat panel display device, such as a liquid crystal display device, another light emitting display device, and an electronic paper display device which has electrophoretic elements, can be mentioned. Further, it is needless to say that the present invention can be applied to a display device ranging from a middle-small type display device to a large type display device, with no limitation.

The various modifications and adjustments to the embodiments will be readily apparent to those skilled in the art, and it is to be understood that these modifications and adjustments are included in the scope of the present invention. For example, the addition or deletion of a constituent element, a change in design, the addition or omission of a process, or a change in conditions which is appropriately performed by a person skilled in art with respect to each of the above described embodiments is also included in the scope of the invention when including the gist of the invention.

Furthermore, regarding the above-described embodiment, any additional advantage and effect which are obvious from the description of the specification or appropriately conceived by a skilled person are considered to be naturally achievable by the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a plurality of display elements provided in a display area;
    a plurality of image signal lines supplying an image signal to the plurality of display elements;
    a plurality of first electrodes arranged on the plurality of display elements, the first electrodes which are adjacent to each other in a first direction from among the plurality of the first electrodes being connected to each other via a first connecting line, and the first electrodes which are adjacent to each other in a second direction intersecting the first direction from among the plurality of the first electrodes not being connected to each other;
    a plurality of second electrodes which are arranged in a layer identical to or different from a layer of the first electrodes, and each of which are surrounded by the first electrodes in a plan view, the second electrodes which are adjacent to each other in a second direction from among the plurality of the second electrodes being connected to each other via a second connecting line intersecting the first connecting line with an interposition of an insulating film in a plan view, and the second electrodes which are adjacent to each other in a first direction from among the plurality of the second electrodes not being connected to each other;
    a plurality of first touch signal lines which are connected to the plurality of first electrodes;
    a plurality of connection terminal provided in the peripheral area;
    a first switch which switches a status of an electric connection between one of the plurality of image signal lines and one of the plurality of connection terminals from connected to disconnected, or vice versa; and
    a second switch which switches a status of an electric connection between one of the plurality of first touch signal lines and the one of the plurality of connection terminals from connected to disconnected, or vice versa.

2. The display device according to claim 1, further comprising:
    a plurality of second touch signal lines which are connected to the plurality of second electrodes;
    a third switch which switches a status of an electric connection between one of the plurality of image signal lines and another one of the plurality of connection terminals from connected to disconnected, or vice versa; and
    a fourth switch which switches a status of an electric connection between one of the plurality of second touch signal lines and the other one of the plurality of connection terminals from connected to disconnected, or vice versa.

3. The display device according to claim 1, wherein the first switch and the second switch operate exclusively.

4. The display device according to claim 2, wherein the third switch and the fourth switch operate exclusively.

5. The display device according to claim 1, further comprising:
    a touch driving circuit which supplies a driving signal to the plurality of second electrodes.

6. The display device according to claim 5, further comprising:
    a scan driving circuit which supplies a scan signal to the plurality of driving elements, wherein the touch driving circuit is arranged on a side opposite from the scan driving circuit with respect to the display area.

7. The display device according to claim 5, wherein the touch driving circuit is arranged on a side opposite from the plurality of connection terminals with respect to the display area.

8. The display device according to claim 1, further comprising:
a first conductive layer formed under the insulating film, and a second conductive layer formed on the insulating film, wherein
each of the plurality of first electrodes, the first connecting line, the plurality of second electrodes, and the second connecting line are included in the first conductive layer and the second conductive layer, and
the first touch signal line is included in the second conductive layer.

9. The display device according to claim 1, further comprising:
a first conductive layer formed under the insulating film, and a second conductive layer formed on the insulating film, wherein
each of the plurality of first electrodes, the first connecting line, the plurality of second electrodes, and the second connecting line are included in the first conductive layer and the second conductive layer, and
the second touch signal line is included in the second conductive layer.

10. The display device according to claim 1, further comprising:
a sealing film which covers, over the plurality of display elements, the display area, wherein
an outer periphery of the sealing film is positioned between the display area and the second switch, and
the plurality of first touch signal lines extend from a position on the sealing film to an outside of the sealing film, going beyond the outer periphery of the sealing film.

11. The display device according to claim 2, further comprising:
a sealing film which covers, over the plurality of display elements, the display area, wherein
an outer periphery of the sealing film is positioned between the display area and the fourth switch, and
the plurality of second touch signal lines extend from a position on the sealing film to an outside of the sealing film, going beyond the outer periphery of the sealing film.

* * * * *